United States Patent [19]
Yaegashi

[11] Patent Number: 4,821,411
[45] Date of Patent: Apr. 18, 1989

[54] METHOD OF MANUFACTURING ELECTRICAL CONTACT PINS
[75] Inventor: Hirokatsu Yaegashi, Tokyo, Japan
[73] Assignee: Hirose Electric Co., Ltd., Tokyo, Japan
[21] Appl. No.: 166,426
[22] Filed: Mar. 10, 1988

Related U.S. Application Data

[60] Continuation-in-part of Ser. No. 945,036, Dec. 22, 1986, abandoned, which is a division of Ser. No. 857,948, May 1, 1986, abandoned.

[30] Foreign Application Priority Data

Jun. 13, 1985 [JP] Japan ................................ 60-128444

[51] Int. Cl.[4] ............................................. H01R 43/16
[52] U.S. Cl. ....................................... 29/874; 72/325
[58] Field of Search ..................... 29/874, 882; 72/324, 72/325

[56] References Cited

U.S. PATENT DOCUMENTS 4,206,964  6/1980  Olsson ........................... 29/874 X
4,513,499  4/1985  Roldan .

FOREIGN PATENT DOCUMENTS 2930560  1/1981  Fed. Rep. of Germany ........ 29/874

Primary Examiner—Howard N. Goldberg
Assistant Examiner—Carl J. Arbes
Attorney, Agent, or Firm—Takeuchi Patent Office

[57] ABSTRACT

A method for manufacturing an electrical contact pin having a compliant part to be fitted into a plated through hole of a diameter of no more than 0.93 mm (0.037″), which includes the steps of stamping a sheet of metal to form an elongated portion with a rectangular cross section in such a manner that the diagonal length of the elongated portion may be less than said diameter; shearing the elongated portion in its axial direction to form two elongated legs offset to a predetermined extent along a shear plane; pressing said offset elongated legs to flatten so that they return to a plane of the sheet metal and expand outwardly to form a thin slot with a pair of short shear ends left at its opposite ends; and coining the shear ends for fine adjustment of the width of the thin slot so that it may be resiliently fitted into the plated through hole.

1 Claim, 3 Drawing Sheets

FIG. 13
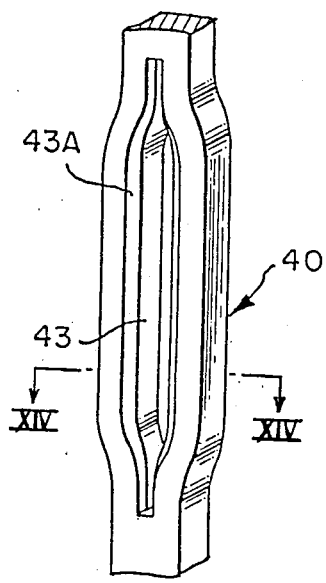
FIG. 14
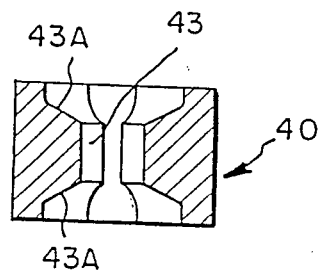
PRIOR ART
FIG. 15
PRIOR ART
FIG. 16
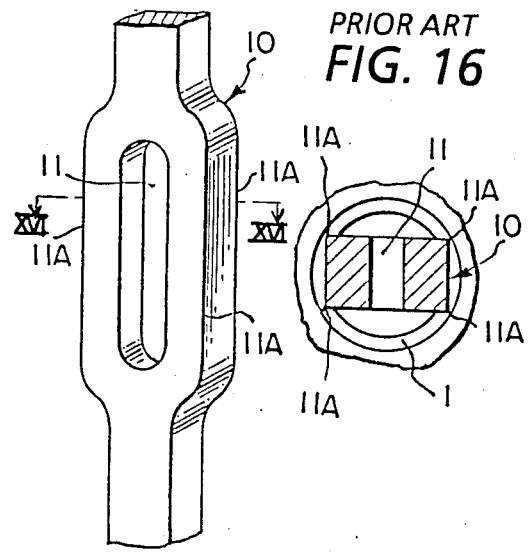
PRIOR ART
FIG. 17
PRIOR ART
FIG. 18
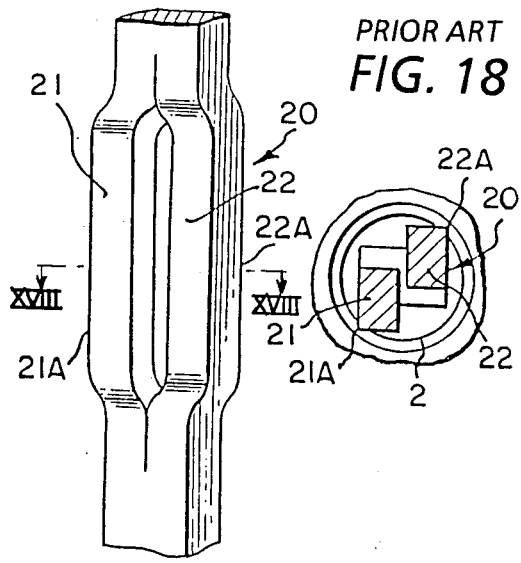

METHOD OF MANUFACTURING ELECTRICAL CONTACT PINS

CROSS-REFERENCES TO RELATED APPLICATIONS

This application is a continuation-in-part of Ser. No. 945,036 filed Dec. 22, 1986, now abandoned, which is a division of Ser. No. 857,948 filed May 1, 1986, now abandoned.

BACKGROUND OF THE INVENTION

The present invention relates to methods for manufacturing electrical contact pins having a compliant part suitable for fitting into a plated-through-hole (PTH) of nor more than 0.93 mm (0.037") in diameter.

In general, electrical contact pins having a compliant part to be fitted into a relatively large PTH, for example 1.0 mm (0.040") in diameter, of a printed circuit board (PCB) for mechanical fixation and electrical connection thereto are well known. For examples, U.S. Pat. Nos. 4,186,982 and 4,513,499 disclose such conventional compliant electrical contact pins. These two examples will be briefly described below with reference to FIGS. 15-17.

The electrical contact pin of FIG. 15, so called "eye of the needle" compliant pin, is made by stamping from a sheet of springy conductive metal so that it has an opening 11 at the center of a compliant part 10 to give a spring property to the compliant part. As FIG. 16 shows this compliant part is fitted into a PTH 1 of a PCB so that its four corners 11A elastically penetrate the conductive wall of the PTH 1 for mechanical fixation and electrical connection thereto.

The electrical contact pin of FIG. 17 is made by first stamping out a compliant part 20 from a sheet of springy conductive metal. Then, the compliant part 20 is sheared to form a pair of legs 21 and 22. These legs are then offset with respect to each other along the shear plane so as to give a spring property to the compliant part. As FIG. 18 shows, the compliant part is fitted into a PTH 2 of a PCB so that a corner 21A of the offset leg 21 and a corner 22A of the offset leg 22 elastically penetrate the conductive wall of the PTH 2 for mechanical fixation and electrical connection.

Recently, electronic parts are densely mounted on a circuit board, and the diameter of PTHs has become smaller than before. Consequently, there is a need to make the compliant part of an electrical contact pin smaller than before. However, it is practically impossible to punch out an opening 11 having a diameter of less than about 0.60 mm (0.024 inch) in the compliant part of an eye of the needle compliant pin of FIGS. 15 and 16. Although the compliant part of a contact pin of FIGS. 17 and 18 is relatively well fitted into a small PTH, there are only two points in contact with the conductive wall of the PTH as shown in FIG. 18, and the contact pin tends to turn during fitting operation. Consequently, the fitting operation requires an extra force to counter the turning force.

SUMMARY OF THE INVENTION

Accordingly, it is an object of the invention to provide a method for manufacturing an electrical contact pin which is free from the above problem.

According to the invention there is provided a method for manufacturing an electrical contact pin having a compliant part to be fitted into a plated through hole of a diameter of no more than 0.93 mm (0.037"), which includes the steps of stamping a sheet of metal to form an elongated portion with a rectangular cross section in such a manner that the diagonal length of the elongated portion may be less than the diameter; shearing the elongated portion in its axial direction to form two elongated legs offset to a predetermined extent along a shear plane; pressing the offset elongated legs to flatten so that they return to a plane of the sheet metal and expand outwardly to form a thin slot with a pair of short shear ends left at its opposite ends; and coining the shear ends for fine adjustment of the width of the thin slot so that it may be resiliently fitted into said plated through hole.

Other objects, features, and advantages of the invention will be apparent from the following description taken in conjunction with the accompanying drawings.

BRIEF DESCRIPTION OF THE DRAWINGS

FIG. 13 is a perspective view of another embodiment of the compliant part of an electrical contact pin according to the invention;

FIG. 14 is a sectional view taken along the line XIV—XIV of FIG. 13;

FIG. 15 is a perspective view of an electrical contact pin according to the prior art;

FIG. 16 is a sectional view taken along the line XVI—XVI of FIG. 15 showing the compliant part of the contact pin, which is fitted into a plated through hole;

FIG. 17 is a perspective view of another electrical contact pin according to the prior art; and FIG. 18 is a sectional view taken along the line XVII—XVII of FIG. 17 showing the compliant part of the contact pin, which is fitted into a plated through hole.

DESCRIPTION OF THE PREFERRED EMBODIMENTS

Figure 1:
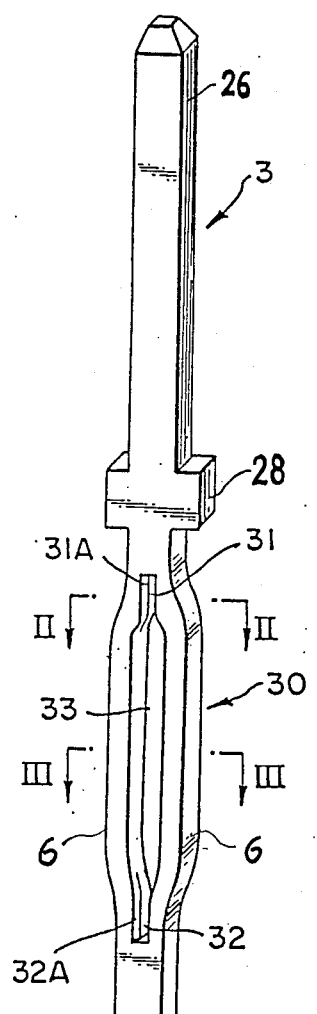
FIG. 1 is a perspective view of an electrical contact pin made by a method of the present invention.
Figure 2:
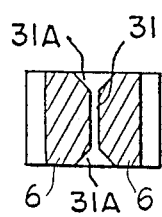
FIGS. 2 and 3 are sectional views taken along the lines II—II and III—III, respectively, of FIG. 1.
Figure 3:
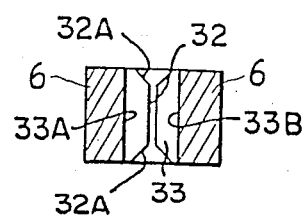

In FIGS. 1, 2, and 3, an electrical contact pin 3 made by a method of the invention includes a head 26, a shoulder 28, and a fixing or compliant part 30 to be fitted into a plated-through-hole (PTH) of about 0.6 mm (0.024") in dia. The compliant part 30 has a pair of elongated legs 6 to define a thin slot 33 with shear ends 31 and 32 at its upper and lower ends. Opposed inside walls 33A and 33B of the elongated legs 6 are not offset with respect to each other along the shear plane. The shear ends 31 and 32 are coined at 31A and 32A, respectively, for making a fine adjustment of the slot width. The elongated leg 6 has a long straight central portion, a pair of short curved portion, and a pair of short straight shear end portions at which two legs join together. The dimensions of a typical pin made by a method of the invention are as follows:

| | |
|---|---|
| Pin length | 20.0 mm (0.789") |
| Pin thickness | 0.40 mm (0.016") |
| Pin width | 0.40 mm (0.016") |
| Shoulder width | 1.80 mm (0.071") |

-continued

| | |
|---|---|
| Shoulder height | 1.20 mm (0.047") |
| Compliant width | 0.82 mm (0.032") |
| Slot length | 2.00 mm (0.079") |
| Slot width | 0.40 mm (0.016") |

FIGS. 4 through 11 illustrate how to make the electrical contact pin of FIG. 1.

Figure 4A:
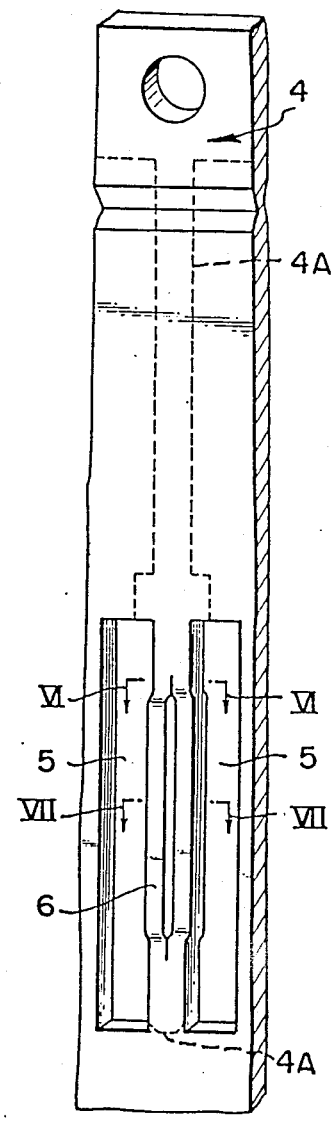
FIGS. 4A, 4B and 5-11 illustrate a method of making the electrical contact pin of FIG. 1.

In FIG. 4A, an array of rectangular openings 5 of about 10 mm by 1.4 mm are punched out from a sheet of springy conductive metal 4 about 0.40 mm thick to form an elongated portion 6 having a rectangular cross-section about 0.42 mm wide and about 0.40 mm thick. Consequently, the diagonal length of the cross section becomes 0.58 mm, which is less than the diameter of the PTH or 0.6 mm (0.024") into which the finished compliant part is to be fitted.

Figure 5:
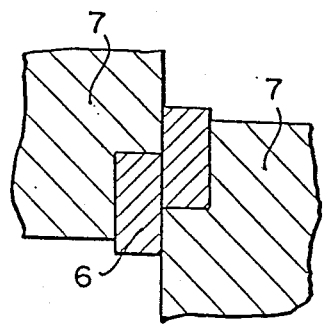
Figure 6:
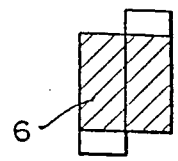
Figure 7:
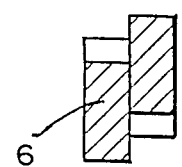

In FIG. 5, the elongated portion 6 is sheared in the axial direction to form a pair of elongated legs 6 which are offset with respect to each other along the shear plane. FIG. 6 shows in section the resulting shear end portion, and FIG. 7 shows in section the offset elongated leg portion.

Figure 8:
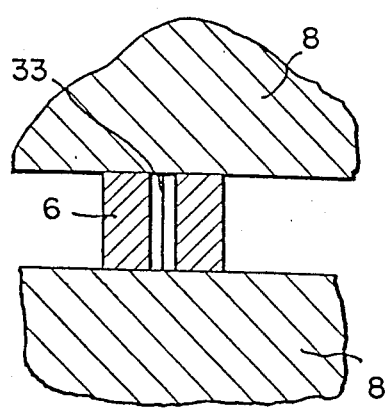

In FIG. 8, the offset elongated legs 6 are pressed between press elements 8 to flatten so that they return to the plane of the sheet material 4 and expand outwardly to such an extent that the elongated legs have been offset with respect to each other along the shear plane. The length of the offset legs 6 is greater than that of the elongated portion itself so that they are bowed outwardly, which is the only direction that they can escape as they are flattened to the original plane. The spring metal has sufficient malleability to extend outwardly without causing any fractures on the legs during this flattening operation. The result is a thin slot 33 produced between the two elongated legs 6, as shown in the Figure. As a result, the diagonal length of cross-section of the elongated legs 6 becomes greater than the diameter of the PTH.

Figure 4B:
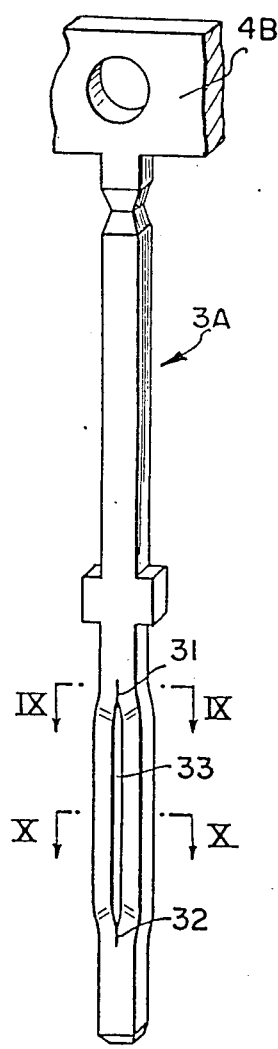
Figure 9:
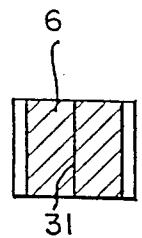
Figure 10:
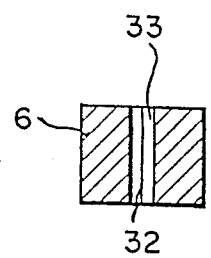

In FIG. 4B, by cutting the metal sheet along a dotted line 4A of FiG. 4A, a pin element 3A connected to a strip 4B is formed. FIGS. 9 and 10 show in section the shear end portion and the expanded straight leg portion, respectively. It is noted that the short shear ends 31 and 32, which have been made by the shearing operation, remain at the upper and lower ends of the long thin slot 33.

Figure 11:
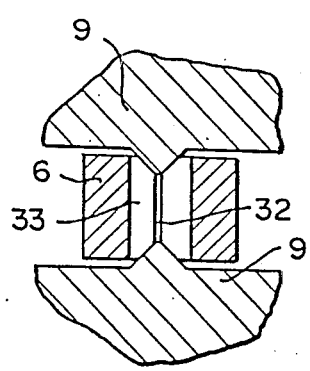

In FIG. 11, the shear ends 31 and 32 are coined by means of press elements 9 to adjust the width of the thin slot 33 to about 0.40 mm and, in turn, the width of a compliant part 30 to 0.82 mm in this embodiment.

Finally, the pin element 3A is severed from the strip 4B to complete a contact pin 3 with the compliant part 30 about 2.0 mm long, 0.82 mm wide, and 0.40 mm thick as shown in FIG. 1.

Figure 12:
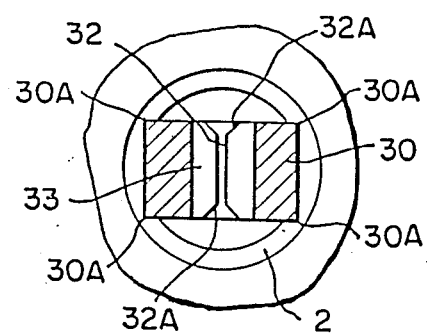
FIG. 12 is a sectional view taken along the line III—III of FIG. 1 showing the compliant part of the contact pin fitted into a plated through hole.

FIG. 12 shows the compliant part 30 in section which is fitted into a PTH 2 about 0.60 mm in diameter. Four corners 30A of the compliant part 30 uniformly penetrate the conductive wall of the PTH 2.

FIG. 13 shows another embodiment of the electrical contact pin according to the invention. This compliant part 40 is identical with that of contact pin 3 of FIG. 1 except that the inside edges 43A of each leg 6 are coined as well as the upper and lower shear ends by means of suitably shaped press elements. The shape of a compliant part may be changed by using differently shaped press elements.

The width of a thin slot formed at the center of a compliant part of a contact pin according to the invention is so small that the outside diameter of the compliant part is sufficiently small to fit into a PTH as small as about 0.6 mm in diameter. When fitted into a PTH, the four corners of the compliant part penetrate the inside wall of the PTH so taht the forces to be applied are balanced, making the fitting operation easier and the resultant electrical and mechanical connection better than before. In addition to the compliant property of the legs, the shear ends at the upper and lower ends of a thin slot are compressed inwardly, thus facilitating the fitting operation and minimizing possible damage to the PTH.

According to the method of the invention, a very thin slot may be made extremely easily at the center of a fixing part to provide an electrical contact pin useful for a very small PTH about 0.6 mm in diameter. By coining the shear ends, the width of a compliant part may be adjusted precisely without difficulty.

While a preferred embodiment of the invention has been described using specific terms, such description is illustrative purposes only, and it is to be understood that changes and variations may be made without departing from the spirit and scope of the invention as recited in the appended claims.

What is claimed is:

1. A method of manufacturing an electrical contact pin having a compliant part to be fitted into a small plated through hole of a diameter of no more than 0.93 mm (0.037"), which comprises the steps of:

stamping a sheet of metal to form an elongated portion with a rectangular cross section in such a manner that the diagonal length of said elongated portion is less than said diameter;

shearing said elongated portion in its axial direction to form two elongated legs which are offset to a predetermined extent along a single vertical shear plane and have a length at least twice a width of said compliant part;

pressing said offset elongated legs between a pair of flat die surfaces to flatten so that they return to a single horizontal plane said predetermined extent being such that when flattened, said elongated legs automatically expand outwardly to form a thin slot with a pair of short shear ends at its opposite ends; and coining said shear ends for fine adjustment of the width of said thin slot so that said compliant part resiliently fits into said small plated through hole.

* * * * *